United States Patent [19]
Mutoh

[11] Patent Number: 5,191,398
[45] Date of Patent: Mar. 2, 1993

[54] CHARGE TRANSFER DEVICE PRODUCING A NOISE-FREE OUTPUT

[75] Inventor: Nobuhiko Mutoh, Tokyo, Japan

[73] Assignee: NEC Corporation, Tokyo, Japan

[21] Appl. No.: 798,360

[22] Filed: Nov. 21, 1991

Related U.S. Application Data

[63] Continuation of Ser. No. 655,171, Feb. 11, 1991, abandoned, which is a continuation of Ser. No. 464,615, Jan. 3, 1990, abandoned, which is a continuation of Ser. No. 239,536, Sep. 1, 1988, abandoned.

[30] Foreign Application Priority Data

Sep. 2, 1987 [JP] Japan .............................. 62-220643
Jan. 8, 1988 [JP] Japan ................................ 63-1898

[51] Int. Cl.⁵ ...................... H01L 29/78; G11C 19/28
[52] U.S. Cl. ..................................... 257/216; 377/60; 257/239
[58] Field of Search ....................... 357/24; 377/57-63

[56] References Cited

U.S. PATENT DOCUMENTS

| | | | |
|---|---|---|---|
| 3,770,988 | 11/1973 | Engeler et al. | 357/24 R |
| 3,918,070 | 11/1975 | Shannon | 357/24 R |
| 4,032,952 | 6/1977 | Ohba et al. | 367/24 M |
| 4,698,656 | 10/1987 | Kamata | 357/24 M |

OTHER PUBLICATIONS

IEEE Journal of Solid-State Circuits, vol. SC-9 (Feb. 1971), pp. 1-12.

Primary Examiner—Gene M. Munson
Attorney, Agent, or Firm—Laff, Whitesel, Conte & Saret

[57] ABSTRACT

A charge transfer device has an output structure formed, in a semiconductor substrate of a first conductivity type, of a base region of a second conductivity type, an output region of the first conductivity type formed in the base region, a reset-drain region of a second conductivity type formed separately from the base region and held at a constant potential, and a reset gate electrode formed on the semiconductor substrate between the base and reset-drain regions via an insulator film to receive a reset pulse. The base region has a portion under the output region which is designed to allow a complete depletion throughout its thickness.

5 Claims, 6 Drawing Sheets

CHARGE TRANSFER DEVICE PRODUCING A NOISE-FREE OUTPUT

This application is a continuation of application Ser. No. 07/655,171, filed Feb. 11, 1991, now abandoned which is a continuation of Ser. No. 07/464,615, filed Jan. 3, 1990, now abandoned; which was a continuation of Ser. No. 07/239,536, filed Sep. 1, 1988, now abandoned.

BACKGROUND OF THE INVENTION

1. Field of the Invention:

This invention relates to a charge transfer device such as a charge coupled device and, more particularly, to an improvement of its output portion for producing a noise-free output.

2. Description of the Prior Art:

Among charge transfer devices, charge coupled devices (CCDs) have been put into practical use in facsimiles, TV cameras, image scaners, and so on. The applicable field of those CCD's are now spreading. There was, however, a drawback in an output structure in which output noises based on the structure were inevitable.

The output structure of CCDs in the prior art is shown in FIGS. 1(a) and 1(b) and its operation will be explained with reference to FIG. 2 and FIGS. 3(a) to 3(c). In a P-type silicon substrate 1, an N-type channel region 2, an N+-type output floating zone 11, an N-type reset-channel region 7, an N+-type reset-drain region 5 and a P+-type channel stopper region 9 are formed. The channel region 2 is composed of a buried-channel type charge transfer register together with a plurality of transfer gate electrodes 31-34 formed in a line on the channel region 2 via a thin insulator film (not shown in FIGS. 1(a) and 1(b)). Here, a constant D.C. voltage is applied to the transfer gate electrode 35. By applying four-phase clock pulses to the transfer gate electrodes 31 to 34, charges are transferred from left to right through a burried channel under the transfer gate electrodes 31 to 35.

At the right end of the channel region 2, the N+-type output floating zone 11 is formed to receive charges transferred through the channel region 2. The voltage at the output floating zone 11 changes in accordance with the quantity of received charges and is amplified to be derived as an output signal by an output amplifier 10. After the output signal is derived, the charges at the output floating zone 11 is drained by making the reset-channel region 7 between the output floating zone 11 and the reset-drain region 5 conductive. For making the reset-channel region 7 conductive, a reset pulse is applied to a reset electrode 8. The output floating zone 11 receives next charges to produce a next output, after the charge drain of the output floating zone 8.

The above-mentioned output operation will be explained in a little more detail. In FIG. 2, (a), (b), (c) and (d) respectively show a clock pulse applied to the transfer gate electrode 34, a D.C. voltage applied to the final stage transfer gate electrode 35, a reset pulse applied to the reset electrode 8 and a constant voltage applied at the reset-drain region 5. FIG. 3(a) is a schematic diagram of FIG. 1(b), FIGS. 3(b) and 3(c) being potential diagrams at times $t_1$ and $t_3$ (see FIG. 2) shown in relation to FIG. 3(a). The read-out operation is performed as one period from a time $T_1$ to a time $T_5$. The charge-drain for resetting the output floating zone 11 is performed within a time duration from $T_1$ to $T_4$. Namely, the reset pulse is applied to the reset electrode 8 at $T_2$ to make a surface portion of the reset-channel region 7 conductive. Under this condition, charges at the output floating zone 11 are drained to the reset-drain region 5. At time $T_3$, the reset pulse disappears from the reset electrode 9, to disconnect the output floating zone 11 from the reset-drain region 5. Thereafter, the clock pulse at the transfer gate electrode 34 lowers to transfer charges thereunder to the output floating zone 11 (see FIG. 3(c)). The output amplifier 10 detects the voltage at the output floating zone 11 generated by the transferred charges. Thus described output operation is repeated to detect all the quantity of charges transferred sequentially through the transfer channel region 2.

The noise inherent to the output structure is a reset noise generated at the reset operation by the reset pulse. There is a capacitance C between the reset electrode 8 and the output floating zone 11. This capacitance is charged by the reset pulse applied to the reset electrode 8. The stored charges determines the voltage at the output floating zone 11 after the reset pulse disappears. This voltage due to the stored charges appears on the output signal as a noise. The value of the stored charges is a function of an absolute temperature T as shown in an equation of a number of equivalent noise charges (i.e. a Nyquist noise) of $$\sqrt{kTC/q}$$

where k is a Boltzmann's constant and q is an electron charge. This is one kind of thermal noises and is described on pages 1 to 12 in IEEE Journal of Solid-State Circuits, Vol. SC-9 (February 1974).

This noise deteriorates a quality of reproduced picture when the output structure is embodied in an image sensor to sense an image having a low illumination intensity. However, the noise may be removed if the output floating zone 11 is made depleted completely to remove all the charges therein just after the reset pulse disappears. This is difficult in the output structure in the prior art, because the impurity concentration of the output floating zone 11 cannot be made such lower value that a complete depletion is possible and has to maintain a value enough for an ohmic connection with wirings for the output amplifier 10. The impurity concentration required for the ohmic connection is more than $1 \times 10^{20}$ cm$^{-3}$ which is too deep to be made depleted completely.

SUMMARY OF THE INVENTION

It is a major object of the present invention to provide a charge transfer device having an output structure for producing a noise-free output.

It is another object of the present invention to provide an output structure used in a charge coupled device for producing an output signal involving no noise which is produced in a reset operation.

According to the present invention, there is provided a charge transfer device formed on a semiconductor substrate of one conductivity type and having a charge transfer channel constructed by forming a serial line of transfer electrodes on the semiconductor substrate through a thin insulator film to transfer charges along the serial line of the transfer electrodes, a base region of the other conductivity type formed in the semiconductor substrate in adjacent to the charge transfer channel, an output region of the one conductivity type formed in the base region, a reset-drain region of the other conductivity type formed in the semiconductor substrate at a portion remote from the base region and a reset-gate electrode formed on the semiconductor substrate between the base and reset-drain regions.

The output structure made of the base region, the output region, the reset-drain region and the reset gate electrode may operate. The transferred charges are injected into the base region to change the voltage thereat. In accordance with the voltage change at the base region, the output region changes its voltage by a capacitive coupling to the base region. The change in voltage at the output region is derived as an output.

In the operation, the impurity concentration of the base region may be made lower than the conventional floating-output region of which impurity concentration cannot be lowered due to an ohmic contact to wirings to an output amplifier. Such low impurity concentration allows the base region to be depleted completely after a reset pulse at the reset gate electrode disappears. Therefore, all the charges can be drained from the base region after the reset operation is completed, resulting in no generation of noise in an output signal.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

Figure 1A:
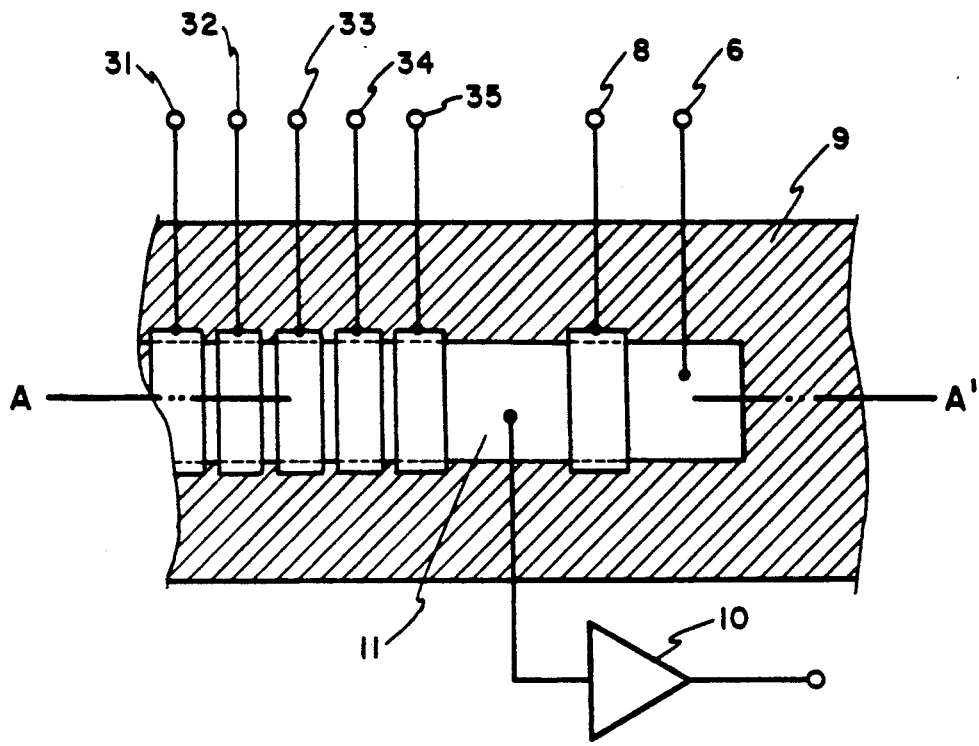
FIG. 1(a) is a plane view of an output portion of a charge coupled device in the prior art and FIG. 1(b) is a sectional view taken along a line A—A' of FIG. 1(a)
Figure 1B:
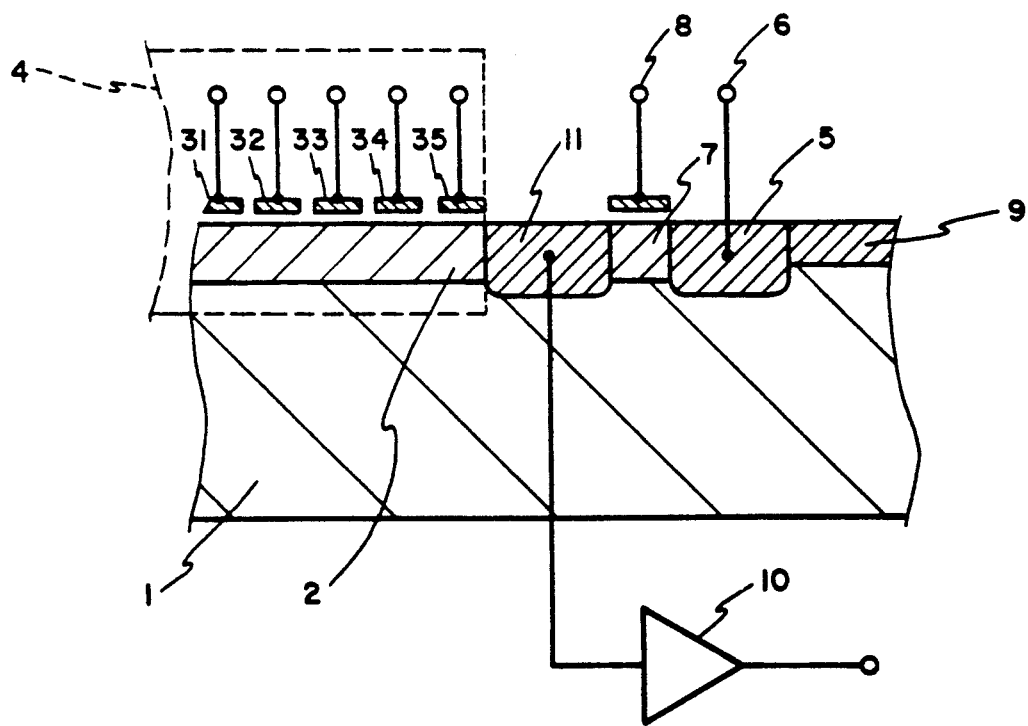
Figure 3:
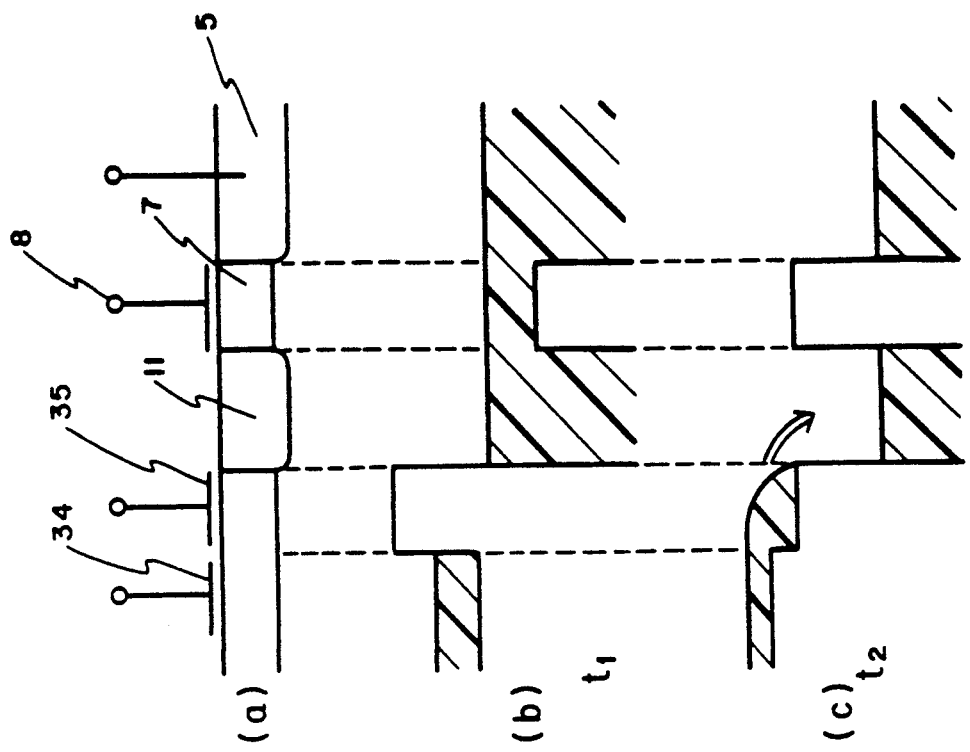
FIGS. 3(a), 3(b) and 3(c) are a schematical sectional view of a charge coupled device shown in FIGS. 1(a) and 1(b) and potential diagrams at and after a reset operation.
Figure 2:
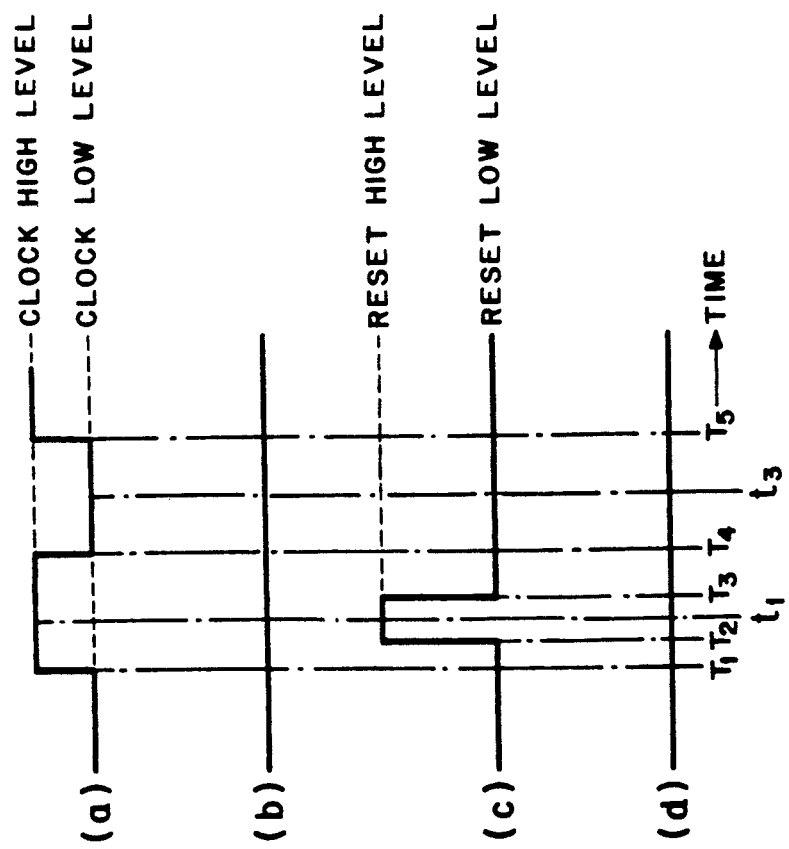
FIG. 2 is a timing chart of a clock pulse (or a transfer pulse), a D.C. voltage at the final stage transfer electrode, a reset pulse and a D.C. voltage at the reset-drain region.
Figure 4A:
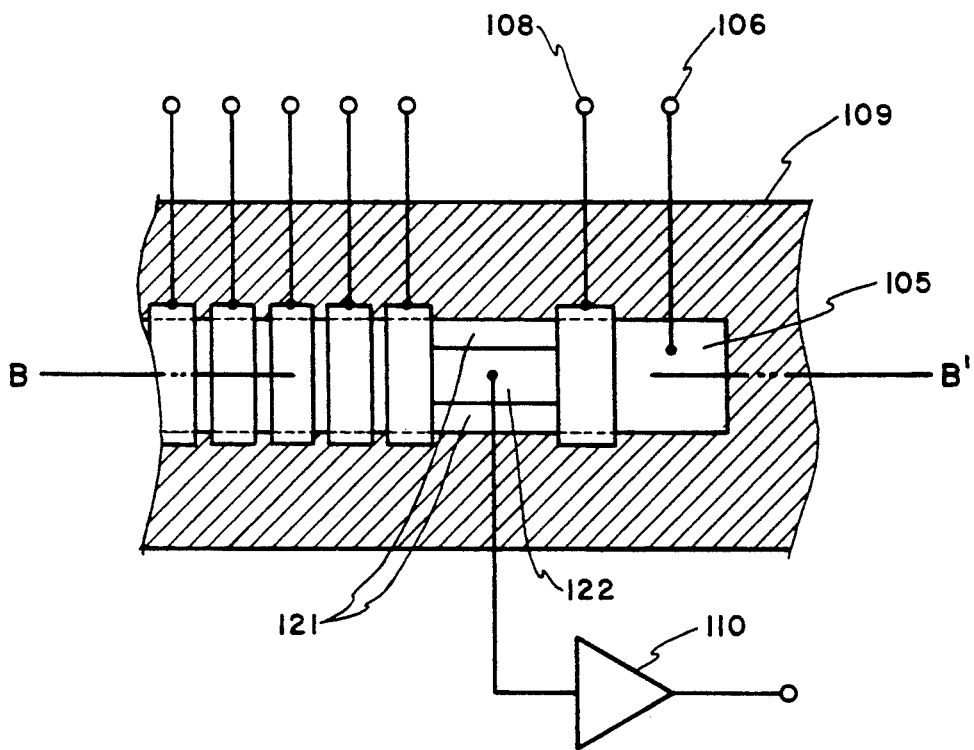
FIG. 4(a) is a plane view of an output portion of the charge coupled device according to a first preferred embodiment of the present invention and FIG. 4(b) is a sectional view taken along the line B—B' of FIG. 4(a)
Figure 4B:
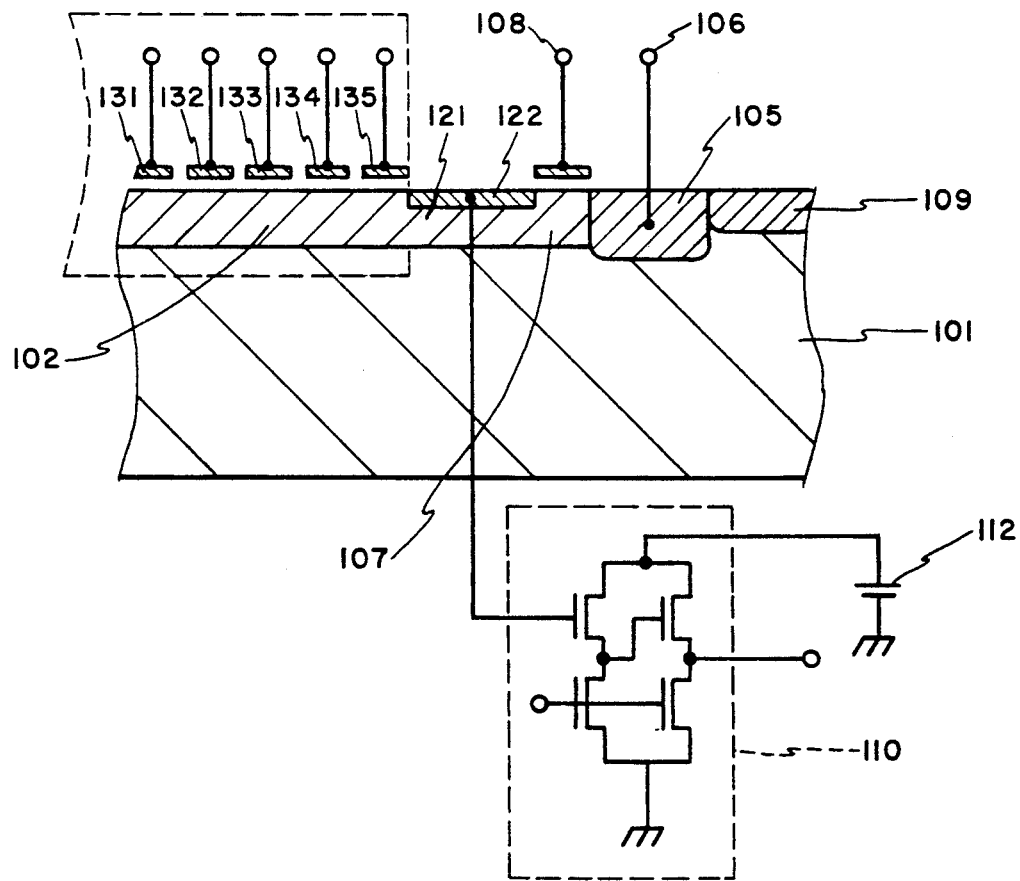

A first preferred embodiment shown in FIGS. 4(a) and 4(b) uses a P-type semiconductor substrate 101 having an impurity concentration of $10^{15}-10^{16}$ cm$^{-3}$. An N-type channel region 102, a base region 121 and an N-type reset channel region 107 are simultaneously formed in a surface region of the substrate 101 with an impurity concentration of $10^{10}-10^{17}$ cm$^{-3}$ and a depth of 0.2–0.8 μm by using an ion-implantation technique. A plurality of transfer gate electrodes 131–135 are formed on the N-type channel region 102 through a thin insulator film (not shown). Alternative ones of the transfer gate electrodes 131–135 may be formed of polycrystalline silicon covered by silicon dioxide layer. The remaining ones of the transfer gate electrodes 131–135 may be aluminum or polycrystalline silicon partially overlapping the former polycrystalline silicon electrodes through the silicon dioxide layer. An output region 122 is formed in the base region 121 as a P-type region having an impurity concentration of $10^{17}-10^{19}$ cm$^{-3}$ and a depth of 0.1–0.5 μm. The output region 121 is separated in plane view from the final stage transfer gate electrode 135 and side periphery of the base region 121. An N-type reset-drain 105 is formed in the substrate 101 in contact with the reset channel region 107 with an impurity concentration of $10^{17}-10^{19}$ cm$^{-3}$ and a depth of 0.2–1 μm. A reset gate electrode 108 is formed on the reset channel region 107. The reset gate electrode 108 is separated in plane view from the output region 122 but is close in plane view to the reset-drain region 105. A p$^+$-type channel stopper region 109 having an impurity concentration of $10^{17}-10^{19}$ cm$^{-3}$ is formed in a surface region of the substrate 101 so as to surround in plane view the channel region 102, the base region 121, the reset channel region 107 and the reset-drain region 105.

Four phase clock (or transfer) pulses are applied to the transfer gate electrodes 131 to 134 to transfer charges from right to left in FIGS. 4(a) and 4(b), while a D.C. voltage of 2-3 volts is applied to the final stage transfer gate electrode 135 to prevent charges from returning from the base region 121 to the channel region 102. An output amplifier 10 is connected to the output region 122. One example of the output amplifier 10 is shown in FIG. 4 and is formed of MOS transistors. A reset pulse is applied to the reset gate electrode 108. The reset-drain region 105 is held at a constant voltage of 15 volts.

Figure 5:
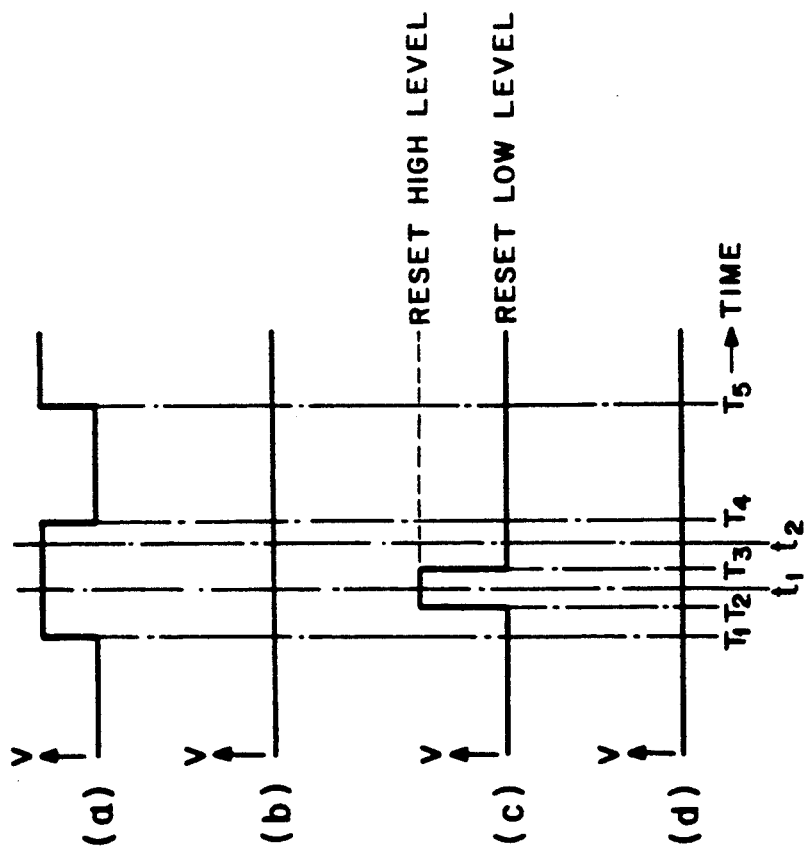
FIG. 5 is a timing chart of a clock (or a transfer) pulse, a D.C. voltage at the final stage transfer electrode, a reset pulse and a D.C. voltage at the reset-drain region.

The timings of the clock (or transfer) pulse (a) and the rest pulse (c) are shown in FIG. 5 together with D.C. voltages (b) and (d) at the final stage transfer gate electrode 135 and the reset-drain region 105. The clock pulse (a) is one applied to the transfer gate electrode 134 which is a preceeding stage of the final stage transfer gate electrode 135. At time $T_1$, the clock pulse (a) at the transfer gate electrode 134 turns to have a high level so as to hold charges under the transfer gate electrode 134. At time $T_2$, the reset pulse (c) is applied to the reset gate electrode 108 to drain charges in the base region 121 to the reset-drain region 105. The reset operation will be explained later with reference to FIGS. 6(a), 6(b) and 6(c). At time $T_3$, the reset pulse disappears. Thereafter, at time $T_4$, the clock pulse (a) turns to have a low level so as to allow charges under the transfer gate electrode 134 to be injected into the base region 121. Due to the injected charges, the potential at the base region 121 changes. Since the output region 122 is held at electrically floating condition, the potential at the output region 122 is also changed in accordance with the potential change of the base region 121 and is amplified by the output amplifier 10 to produce an output signal.

Figure 6:
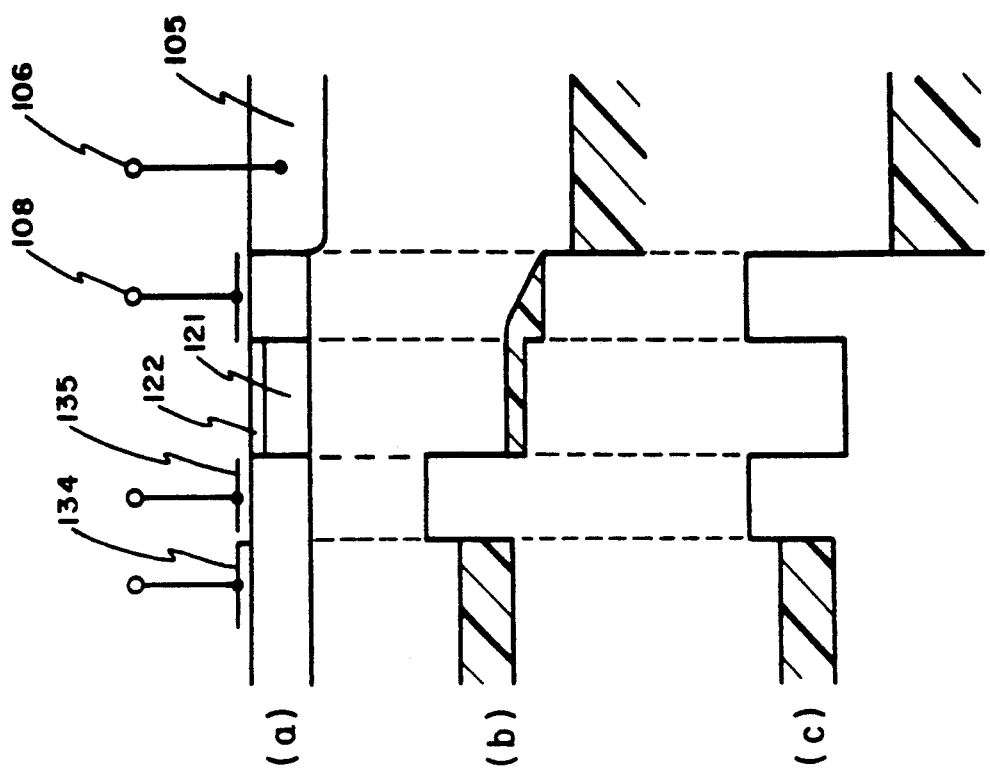
FIGS. 6(a), 6(b) and 6(c) are a schematic sectional view of the first preferred embodiment of the present invention and potential diagrams at and after a reset operation.

The reset operation will be explained. FIG. 6(b) is a potential diagram at the time $t_1$ (see FIG. 5) in the reset operation and FIG. 6(c) is at the time $t_2$ after the reset operation. The base region 121 has an impurity concentration which is as low as $10^{16}$–$10^{17}$ cm$^{-3}$ and a depth of 0.2–0.8 μm. Therefore, the potential well at the base region 121 is shallower than the potential at the reset-drain region 105 and may be driven into a completely depleted state. This complete depletion means that the base region 121 may become a state where all the charges are removed.

In response to the reset pulse (see FIG. 6(b)), the potential under the reset gate electrode 108 becomes lower to make charges in the base region 121 flow into the reset-drain region 105. Since the potential well at the base region 121 is shallower than the potential at the reset-drain region 105, all the charges in the base region 121 are drained. For the complete drain of charges, the potential under the reset gate electrode 108 is necessary to be between the potentials of the base region 121 and the reset-drain region 105 and is to be about 15 volts. After the reset operation, the reset pulse disappears to have a potential relationship shown in FIG. 6(c). The potential under the reset gate electrode 108 rises to separate the potentials at the base and reset-drain regions 121 and 105. At this state, there is no charge in the base region 121, resulted in no noise in an output signal derived from the output amplifier 10.

Figure 7A:
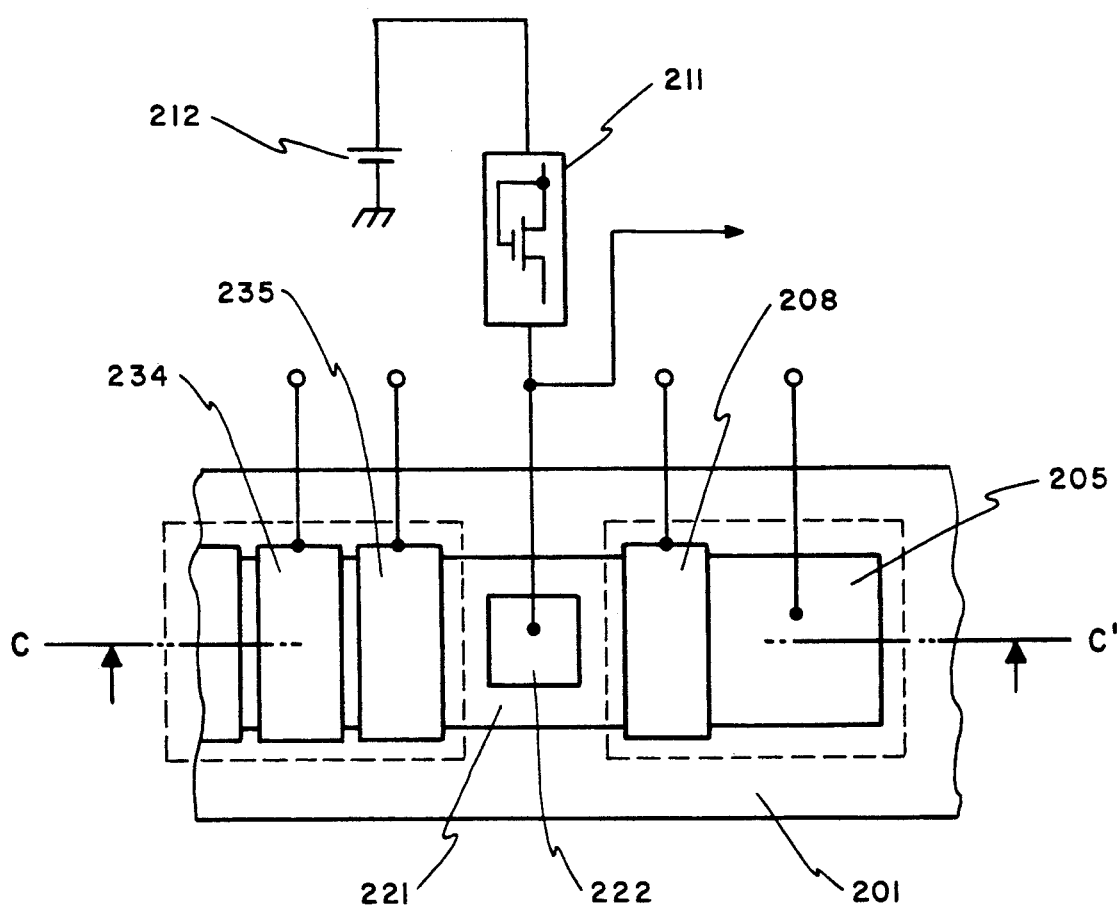
FIG. 7(a) is a plane view of an output portion of the charge coupled device according to a second preferred embodiment of the present invention and FIG. 7(b) is a sectional view taken along the line C—C' of FIG. 7(a)
Figure 7B:
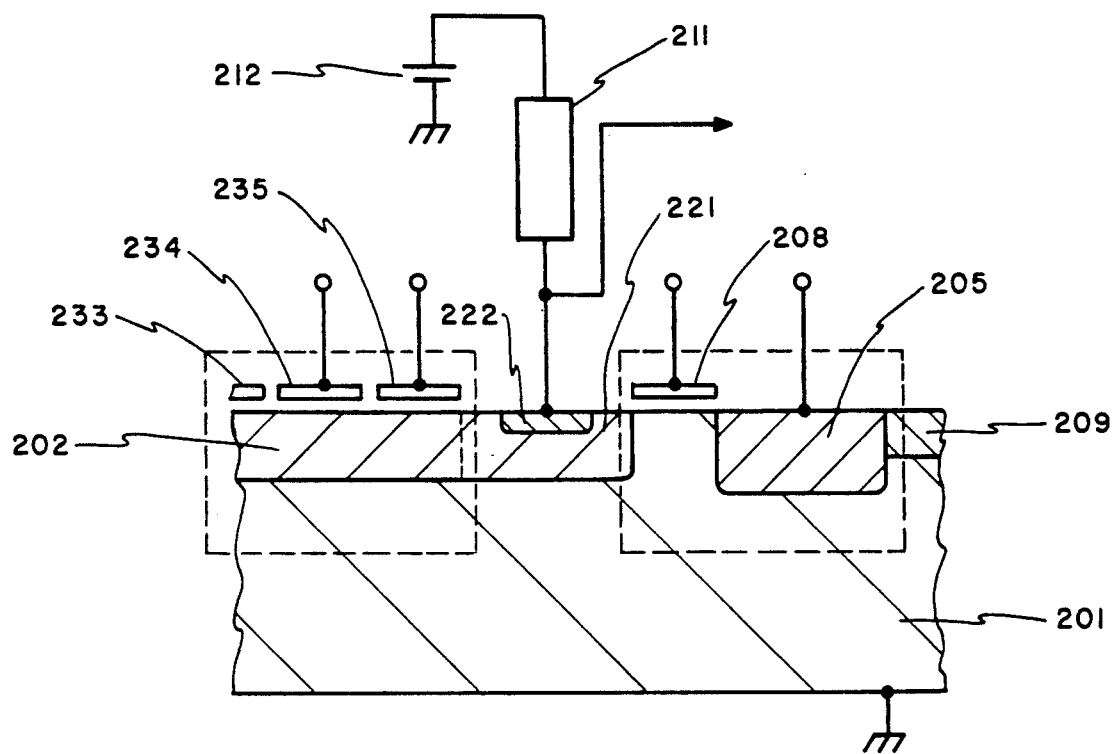

The second preferred embodiment shown in FIGS. 7(a) and 7(b) differs from the first preferred embodiment only at a portion under the gate electrode 208. The base region 221 is an N-type and has an impurity concentration of $10^{16}$–$10^{17}$ cm$^{-3}$ and a depth of 0.2–0.8 μm. The base region 221 is continuously formed from the N-type channel region 202 but terminated at an edge of the reset gate electrode 208. The output region 222 formed in the base region 221 is a P-type and has an impurity concentration of $10^{17}$–$10^{18}$ cm$^{-3}$ and a depth of 0.1–0.5 μm. A load 211 is connected to the output region 222. A positive voltage is applied to the output region 222 from a voltage source 212 of 15 volts through the load 211. Any resistive elements may be used for the load 211. One example of the resistive elements is shown in FIG. 7(a) and is a MOS transistor having a source-gate connection to operate as an active load. An output signal is derived from a connection point between the load 211 and the output region 222.

A reset-drain region 205 is formed at a position remote from the base region 221. A reset gate electrode 208 is formed on a portion of the substrate 201 between the base region 221 and the reset-drain region 205 through a thin insulator film (not shown). The reset-drain region 205 is an N-type and has an impurity concentration of $10^{17}$–$10^{18}$ cm$^{-3}$ and a depth of 0.2–1 μm. It is noted that the portion of the substrate 201 under the reset gate electrode 208 may be doped with N-type impurities to an impurity concentration of $10^{16}$–$10^{17}$ cm$^{-3}$.

Figure 8:
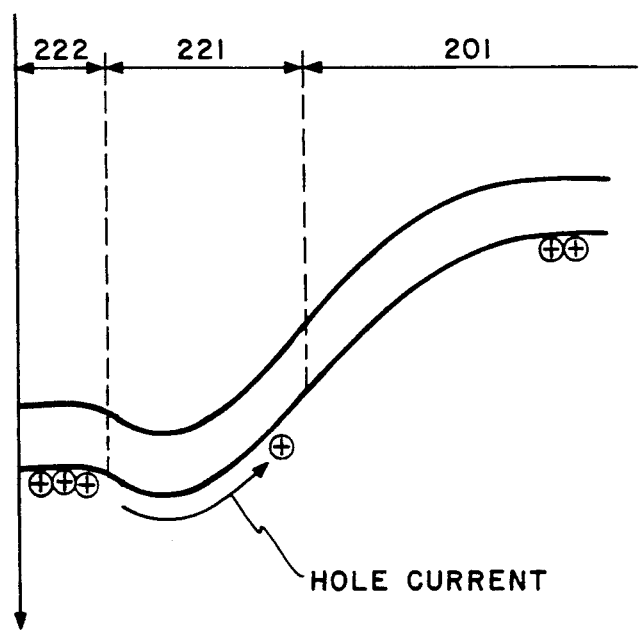
FIG. 8 is an energy band diagram at an output portion of the second preferred embodiment of the present invention.

The energy band diagram at a portion including the output region 222, the base region 221 and the substrate 201 is shown in FIG. 8. Since the base region 221 is completely depleted, a current of holes flows from the output region 222 to the substrate 201 and is modulated by charges injected into the base region 221 from the N-type channel region 202. The modulated current is converted into a voltage form by the load 211 to be derived as an output signal from the connection point between the load 211 and the output region 222.

The reset operation is performed by applying a reset pulse to the reset gate electrode 208. In response to the reset pulse, the base region 221 is electrically connected to the reset-drain region to drain all the charges in the base region. Since the base region 221 has such impurity concentration and depth that all thickness under the output region 222 becomes a complete depletion, no charge remains in the base region 221 after the reset pulse disappears. Thus, any reset noise is not applied to the final output signal.

As mentioned foregoing, the output structure of the charge transfer devices according to the present invention does not produce any reset noise in the output signal. Therefore, the charge transfer device may transfer and detect a small quantity of charges without accompanying noise. If the output structure of the present invention is applied to an image sensor, an image having a very low illumination intensity can be sensed to reproduce an image having a superior quality. Although, the output structure of the present invention is applied to a buried channel charge coupled device in the above-explained embodiment, it may be equally applicable to a surface channel charge coupled device.

What is claimed is:

1. A charge transfer device formed on a semiconductor substrate having an impurity concentration of $10^{15}$–$10^{16}$ cm$^{-3}$ of a first conductivity type, said charge transfer device comprising:

a charge transfer channel constructed by forming a plurality of transfer electrodes in a line on said semiconductor substrate via an insulator film;

a base region of a second conductivity type formed in said semiconductor substrate to receive charges transferred along said charge transfer channel, said base region having a thickness of 0.2–0.8 μm and an impurity concentration of $10^{16}$–$10^{17}$ cm$^{-3}$ and being separated from said transfer electrodes in plan view;

an output region of said first conductivity type formed in said base region, said output region having an impurity concentration of $10^{17}$–$10^{19}$ cm$^{-3}$ and being surrounded by said base region at a surface of said semiconductor substrate;

an output terminal connected to said output region in order to derive an electrical output signal in accordance with a quantity of charges received by said base region;

a reset-drain region of said second conductivity type formed in said semiconductor substrate at a first portion which is remote from said base region, said reset-drain region being held at a constant voltage; and a reset gate electrode formed on said semiconductor substrate at a second portion located between said base region and said reset-drain region, said reset gate electrode being supplied with a reset pulse which produces a potential in said semiconductor substrate thereunder, said potential having a value which is intermediate between the values at said base and reset-drain regions, wherein, in response to said reset pulse, said base region is supplied with a biasing voltage from said reset drain region so as to be completely depleted by a depletion layer extending from said output region throughout said thickness of said base region.

2. A charge transfer device as claimed in claim 1, wherein said second portion of said semiconductor substrate is a region of said second conductivity type.

3. A charge transfer device as claimed in claim 2, wherein said second portion of said semiconductor substrate is a region of said first conductivity type.

4. A charge detector formed to receive charges on a semiconductor substrate having an impurity concentration of $10^{15}$–$10^{16}$ cm$^{-3}$ of a first conductivity type, said charge detector comprising:

- a first region of a second conductivity type formed in said semiconductor substrate to receive said charges, said first region having a thickness of 0.2–0.8 μm and an impurity concentration of $10^{16}$–$10^{17}$ cm$^{-3}$;
- a second region of said first conductivity type formed in said first region with an impurity concentration of $10^{17}$–$10^{19}$ cm$^{-3}$, said second region being completely surrounded by said first region at a surface of said semiconductor substrate;
- means for deriving an output signal from said second region in accordance with a quantity of charges received by said first region;
- a third region of said second conductivity type formed in said semiconductor substrate, said third region being separated from said first region and held at a constant voltage; and
- a reset gate electrode formed on said semiconductor substrate between said second and third regions through an insulator film, said reset gate electrode being supplied with a reset pulse which has a voltage produced in said semiconductor substrate under said reset gate, said produced voltage having a potential which is between said second and third regions, wherein, in response to said reset pulse, said first region under said second region is electrically connected to said third region in order to be completely depleted.

5. A charge detector as claimed in claim 4, wherein a fourth region of said second conductivity type is further formed in a surface portion of said semiconductor substrate under said reset gate electrode.

* * * * *